US 11,770,128 B2

(12) United States Patent
Singh et al.

(10) Patent No.: US 11,770,128 B2
(45) Date of Patent: Sep. 26, 2023

(54) TIME-INTERLEAVED A/D CONVERTERS WITH ISOLATION INDUCTORS

(71) Applicant: Omni Design Technologies Inc., Milpitas, CA (US)

(72) Inventors: Vikas Singh, Newark, CA (US); Vaibhav Tripathi, Santa Clara, CA (US); Denis Clarke Daly, Wellesley, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 0 days.

(21) Appl. No.: 17/810,386

(22) Filed: Jul. 1, 2022

(65) Prior Publication Data
US 2022/0337267 A1 Oct. 20, 2022

Related U.S. Application Data

(63) Continuation of application No. 17/193,359, filed on Mar. 5, 2021, now Pat. No. 11,438,002.

(60) Provisional application No. 62/986,185, filed on Mar. 6, 2020.

(51) Int. Cl.
*H03M 1/36* (2006.01)
*H03M 1/12* (2006.01)

(52) U.S. Cl.
CPC ................................ *H03M 1/1245* (2013.01)

(58) Field of Classification Search
CPC .................................................. H03M 1/1245
USPC ........................................ 341/122, 159, 155
See application file for complete search history.

(56) References Cited

U.S. PATENT DOCUMENTS

| | | | |
|---|---|---|---|
| 4,845,382 A | 7/1989 | Eouzan et al. | |
| 5,729,178 A | 3/1998 | Park et al. | |
| 5,757,857 A | 5/1998 | Buchwald | |
| 8,340,616 B2 * | 12/2012 | Shah | H03J 5/244 455/286 |
| 9,294,112 B1 | 3/2016 | Devarajan et al. | |
| 9,793,910 B1 | 10/2017 | Devarajan | |
| 2008/0001671 A1 * | 1/2008 | Cao | H03F 1/565 330/286 |
| 2014/0048682 A1 | 2/2014 | Kim et al. | |
| 2014/0070971 A1 | 3/2014 | Zabroda | |
| 2014/0254223 A1 * | 9/2014 | Limpaecher | H02M 7/4826 363/126 |
| 2015/0084800 A1 | 3/2015 | Zhang et al. | |
| 2016/0105195 A1 | 4/2016 | Mulder | |

(Continued)

OTHER PUBLICATIONS

W. C. Black et al., "Time-interleaved converter arrays", IEEE J. Solid-State Circuits, Dec. 1980, pp. 1022-1029, vol. 15, No. 12, IEEE.

(Continued)

*Primary Examiner* — Peguy Jean Pierre
(74) *Attorney, Agent, or Firm* — Intrinsic Law Corp.

(57) ABSTRACT

A time-interleaved circuit includes an input buffer, a plurality of track-and-hold circuits, and a plurality of isolation inductors. The input buffer is configured to receive an input signal having an input voltage and to output an output signal having an output voltage. The track-and-hold circuits are electrically coupled in parallel with each other. Each track-and-hold circuit is electrically coupled in series with the input buffer. Each isolation inductor is electrically coupled to the output of the input buffer and at least one of the track-and-hold circuits.

8 Claims, 8 Drawing Sheets

(56) References Cited

U.S. PATENT DOCUMENTS

| | | |
|---|---|---|
| 2017/0285833 A1 | 10/2017 | Shahrokhi et al. |
| 2019/0222175 A1 | 7/2019 | Khlat et al. |
| 2021/0281271 A1 | 9/2021 | Bales et al. |
| 2021/0351781 A1 | 11/2021 | Daly et al. |

OTHER PUBLICATIONS

B. Razavi, "Design Considerations for Interleaved ADCs", IEEE J. Solid-State Circuits, Aug. 2013, pp. 1806-1817, vol. 48, No. 8, IEEE.

N. Kurosawa et al., "Explicit analysis of channel mismatch effects in time-interleaved ADC systems", IEEE Transactions on Circuits and Systems I: Fundamental Theory and Applications, Mar. 2001, pp. 261-271, vol. 48, No. 3, IEEE.

R. Jewett et al., "A 12b 128MSamplels ADC with 0.05LSB DNL," IEEE International Solid-State Circuits Conference Digest of Technical Papers, Feb. 1997, pp. 138-139, IEEE.

K. Poulton et al., "A20GS/s 8b ADC with a 1MB Memory in 0.18,um CMOS", Dig. Tch. Papers, 2003, pp. 318-319, ISSCC.

J. Elbornsson et al., "Blind estimation of timing errors in interleaved AD converters", IEEE International Conference on Acoustics, Speech, and Signal Processing. Proceedings (Cat. No. 01CH37221), 2001, pp. 3913-3916, vol. 6, Salt Lake City, UT, USA.

M. El-Chammas et al., "A 12-GS/s 81-mW 5-bit Time-Interleaved Flash ADC With Background Timing Skew Calibration", J. Solid-State Circuits, Apr. 2011, pp. 838-847, vol. 46, No. 4, IEEE.

S. Devarajan et al.,"A 12-b 10-GS/s Interleaved Pipeline ADC in 28-nm CMOS Technology", J. Solid-State Circuits, Dec. 2017, pp. 3204-3218, vol. 52, No. 12, IEEE.

S. Lee et al., "A 1GS/s 10b 18.9mW time-interleaved SAR ADC with background timing-skew calibration," International Solid-State Circuits Conference Digest of Technical Papers, Feb. 2014, pp. 384-385, IEEE.

M. Tamba et al., "A method to improve SFDR with random interleaved sampling method", Proceedings International Test Conference 2001 (Cat. No. 01CH37260), 2001, pp. 512-520, Baltimore, MD, USA.

J. Elbornsson et al., "Analysis of mismatch noise in randomly interleaved ADC system", International Conference on Acoustics, Speech, and Signal Processing, 2003. Proceedings. (ICASSP '03)., 2003, pp. VI-280, IEEE.

ISR, "International Search Report", PCT/US21/71337, dated Feb. 16, 2022.

* cited by examiner

TIME-INTERLEAVED A/D CONVERTERS WITH ISOLATION INDUCTORS

CROSS-REFERENCE TO RELATED APPLICATIONS

This application is a continuation of U.S. application Ser. No. 17/193,359, titled "Time-Interleaved A/D Converters with Isolation Inductors," filed on Mar. 5, 2021, which claims priority to U.S. Provisional Application No. 62/986,185, titled "Time-Interleaved ND Converters with Isolation Inductors," filed on Mar. 6, 2020, each of which is hereby incorporated by reference.

TECHNICAL FIELD

This application relates generally to analog-to-digital converters (ADCs).

BACKGROUND

A key building block of high-speed (>1 GS/s), high-resolution (>10-bits) ADC is the input buffer, and is employed to drive the ADC frontend, which comprises of a track-and-hold (T/H) circuit. T/H circuits are often implemented by a high-speed, highly linear sampling switch and on-chip sampling capacitor, which together present a switching load to the input buffer. Consequently, in addition to driving the analog input signal, the input buffer also needs to absorb and settle the voltage kickback caused by the switched capacitor load. This issue is further exacerbated in time-interleaved ND converters, in which several T/H circuits are driven in sequence by the buffer.

FIG. 1 illustrates an ADC frontend 10 driven by an input buffer 100. The input buffer 100 is electrically coupled to multiple T/H circuits 110, which are electrically coupled in parallel with each other. FIG. 2 illustrates a timing diagram 200 of the ADC frontend 10 and the corresponding input and output voltages ($V_{IN}$, $V_{OUT}$) 210 of the input buffer 100. The ADC sampling frequency is denoted by "fs" and each T/H circuit 110 tracks for Ts=1/fs duration. At the sampling instants, the sampling switch is turned off (i.e., opened) resulting in voltage kickback as depicted in the $V_{OUT}$ waveform. The signal-dependent fraction of this kickback, if not fully settled, will exhibit as non-linearity at the ADC output thereby degrading the ADC performance. As a result, additional power consumption is required in the input buffer to increase bandwidth and reduce the output impedance in order to absorb and fully settle the voltage kickback. This additional power dissipation results in higher buffer area as well as degrades the ADC figure-of-merit, both of which are undesirable.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a time-interleaved circuit, comprising: an input buffer configured to receive an input signal having an input voltage and to output an output signal having an output voltage; a plurality of track-and-hold circuits electrically coupled in parallel with each other, each track-and-hold circuit electrically coupled in series with the input buffer; and an isolation inductor electrically coupled to the output of the input buffer and at least one of the track-and-hold circuits.

In one or more embodiments, the time-interleaved circuit comprises an analog-to-digital converter. In one or more embodiments, the isolation inductor is a first isolation inductor in a plurality of isolation inductors, each isolation inductor electrically coupled to the output of the input buffer and only one of the track-and-hold circuits. In one or more embodiments, each track-and-hold circuit comprises a sampling switch and a sampling capacitor.

In one or more embodiments, the isolation inductor is a first isolation inductor and the input buffer is a first input buffer, and the circuit further comprises: first and second groups of the track-and-hold circuits; a second input buffer configured to receive the input signal; and a second isolation inductor. The first isolation inductor is electrically coupled to the output of the first input buffer and an input of the first group of the track-and-hold circuits. The second isolation inductor is electrically coupled to an output of the second input buffer and an input of the second group of the track-and-hold circuits. In one or more embodiments, each track-and-hold circuit comprises a respective sampling switch and a respective sampling capacitor; the respective sampling switches in the first group of the track-and-hold circuits are electrically coupled to respective odd drive signals that cause the respective sampling switches in the first group to open on respective odd clock cycles; and the respective sampling switches in the second group of the track-and-hold circuits are electrically coupled to respective even drive signals that cause the respective sampling switches in the second group to open on respective even clock cycles. In one or more embodiments, the respective odd drive signals and the respective even drive signals are configured to cause the respective sampling switches in the first and second groups to open in a predetermined sequence such that only one sampling switch transitions to an open state in a given clock cycle.

In one or more embodiments, the circuit further comprises a third group of track-and-hold circuits; a third input buffer configured to receive the input signal; and a third isolation inductor, wherein the third isolation inductor is electrically coupled to the output of the third input buffer and an input of the third group of the track-and-hold circuits. In one or more embodiments, the circuit further comprises a fourth group of track-and-hold circuits; a fourth input buffer configured to receive the input signal; and a fourth isolation inductor, wherein the fourth isolation inductor is electrically coupled to the output of the fourth input buffer and an input of the fourth group of the track-and-hold circuits.

In one or more embodiments, the input buffer comprises a source follower amplifier. In one or more embodiments, the input buffer comprises a push-pull amplifier. In one or more embodiments, the isolation inductor has an inductance of less than or equal to about 100 pH. In one or more embodiments, the circuit is integrated into a single chip.

Another aspect of the invention is directed to a time-interleaved circuit, comprising: a first input buffer configured to receive an input signal having an input voltage and to output a first output signal having a first output voltage; a second input buffer configured to receive the input signal and to output a second output signal having a second output voltage; a first group of track-and-hold circuits electrically coupled in parallel with each other, each track-and-hold circuit in the first group electrically coupled in series with the first input buffer; a second group of track-and-hold circuits electrically coupled in parallel with each other, each track-and-hold circuit in the second group electrically coupled in series with the second input buffer; a first isolation inductor electrically coupled to the output of the first input buffer and the track-and-hold circuits in the first group; and a second isolation inductor electrically coupled to the output of the second input buffer and the track-and-hold circuits in the second group.

In one or more embodiments, each track-and-hold circuit in the first and second groups comprises a respective sampling switch and a respective sampling capacitor; the respective sampling switches in the first group of the track-and-hold circuits are electrically coupled to respective odd drive signals that cause the respective sampling switches in the first group to open on respective odd clock cycles; and the respective sampling switches in the second group of the track-and-hold circuits are electrically coupled to respective even drive signals that cause the respective sampling switches in the second group to open on respective even clock cycles. In one or more embodiments, the respective odd drive signals and the respective even drive signals are configured to cause the respective sampling switches in the first and second groups to open in a predetermined sequence such that only one sampling switch transitions to an open state in a given clock cycle.

In one or more embodiments, the first input buffer comprises a first source follower amplifier, and the second input buffer comprises a second source follower amplifier. In one or more embodiments, the first input buffer comprises a first push-pull amplifier, and the second input buffer comprises a second push-pull amplifier. In one or more embodiments, the time-interleaved circuit comprises an analog-to-digital converter. In one or more embodiments, the first and second isolation inductors each have an inductance of less than or equal to about 100 pH. In one or more embodiments, the circuit is integrated into a single chip.

In one or more embodiments, the circuit further comprises a third input buffer configured to receive the input signal and to output a third output signal having a third output voltage; a third group of track-and-hold circuits electrically coupled in parallel with each other, each track-and-hold circuit in the third group electrically coupled in series with the third input buffer; and a third isolation inductor electrically coupled to the output of the third input buffer and the track-and-hold circuits in the third group. In one or more embodiments, the circuit further comprises a fourth input buffer configured to receive the input signal and to output a fourth output signal having a fourth output voltage; a fourth group of track-and-hold circuits electrically coupled in parallel with each other, each track-and-hold circuit in the fourth group electrically coupled in series with the fourth input buffer; and a fourth isolation inductor electrically coupled to the output of the fourth input buffer and the track-and-hold circuits in the fourth group.

BRIEF DESCRIPTION OF THE DRAWINGS

For a fuller understanding of the nature and advantages of the present concepts, reference is made to the detailed description of preferred embodiments and the accompanying drawings.

DETAILED DESCRIPTION

A time-interleaved (TI) circuit includes a plurality of isolation inductors that are electrically coupled to an input buffer and one or more T/H circuits. The isolation inductors reduce kickback in the output voltage of the output signal produced by the input buffer. In one embodiment, the TI circuit includes the same number of isolation inductors and T/H circuits such that each isolation inductor is electrically coupled to a respective T/H circuit. In another embodiment, the TI circuit includes only first and second isolation inductors. The first isolation inductor is electrically coupled to a first group of T/H circuits. The second isolation inductor is electrically coupled to a second group of T/H circuits. Each isolation inductor can be electrically coupled to a respective input buffer (e.g., to first and second input buffers). The driving signals for T/H circuits can cause the first and second groups to be phase-offset such that the driving signals alternately cause a sampling switch in the T/H circuit in the first group to transition to the open state and a sampling switch in the T/H circuit in the second group to transition to the open state (e.g., in a ping-pong configuration).

Figure 3:
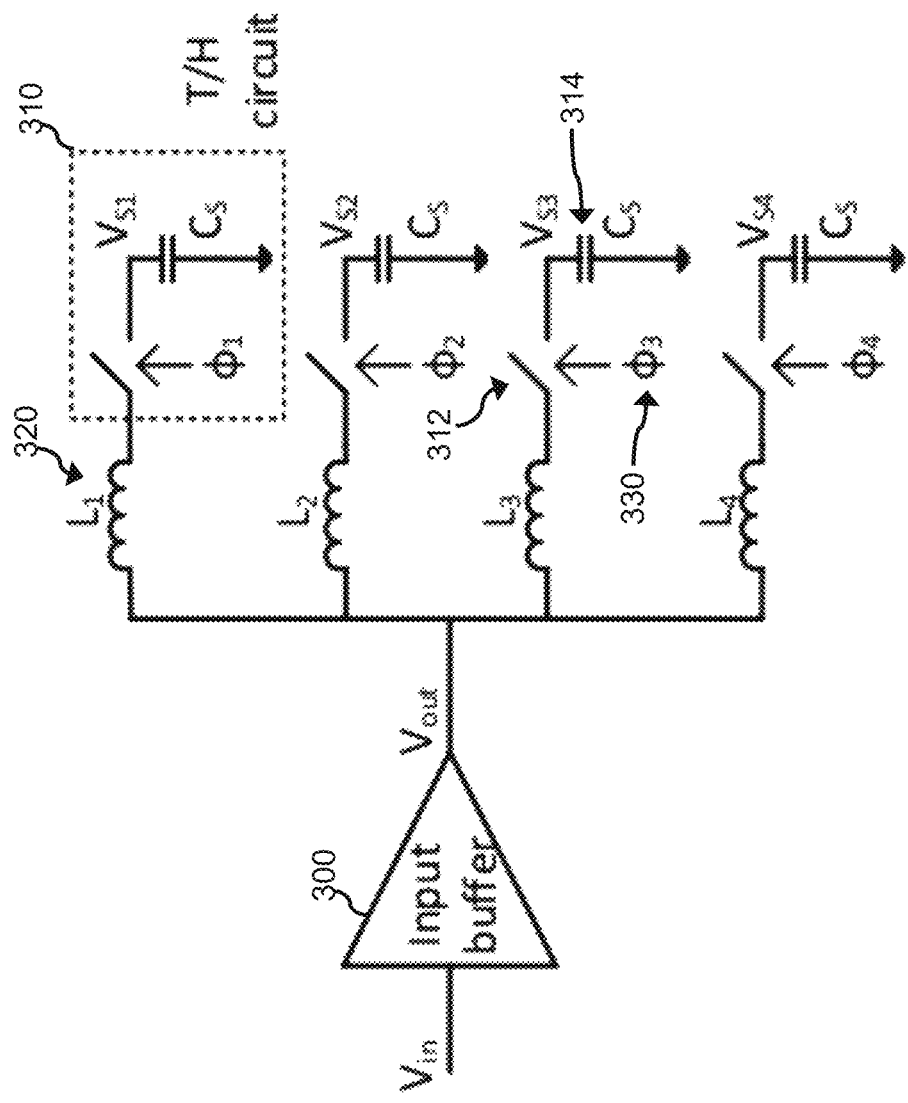
FIG. 3 is a schematic diagram of a time-interleaved (TI) circuit according to an embodiment.

FIG. 3 is a schematic diagram of a TI circuit 30 according to an embodiment. The circuit 30 includes an input buffer 300, a plurality of T/H circuits 310, and a plurality of isolation inductors 320. The input buffer 300 is configured to receive an input signal having an input voltage $V_{IN}$ which can be time-varying. The input buffer 300 produces an output signal having an output voltage $V_{OUT}$ that can be related to the input signal and input voltage, respectively.

Figure 4:
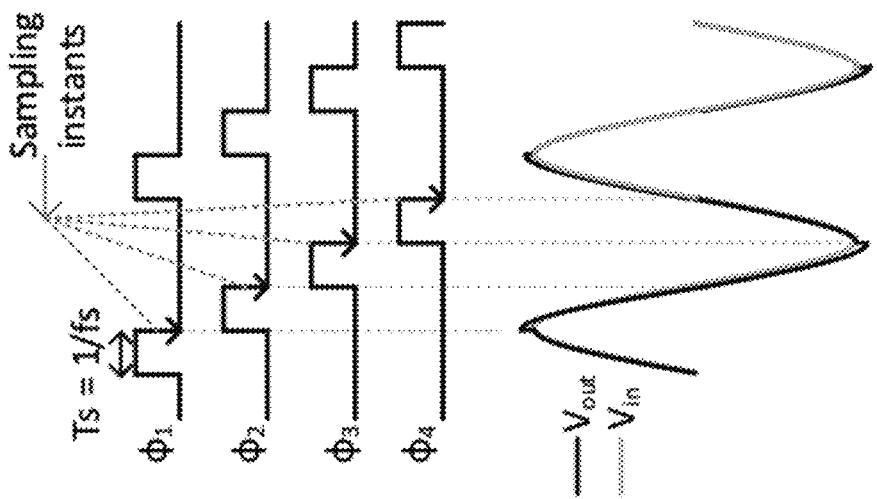
FIG. 4 illustrates a timing diagram and the corresponding input and output voltages of the TI circuit illustrated in FIG. 3.

The T/H circuits 310 are electrically coupled in parallel with each other. The T/H circuits 310 can comprise sample-and-hold circuits or ADCs in some embodiments. Each T/H circuit 310 includes a sampling switch 312 and a sampling capacitor 314. The state of each sampling switch 312 is controlled by a respective drive signal 330. The drive signals 330 are configured to cause the sampling switches 312 to transition from a closed state to an open state. The drive signals 330 are phase-offset such that the sampling switches 312 enter the open state on different clock cycles and/or in a predetermined time sequence (e.g., as illustrated in FIG. 4). For example, drive signal $\Phi_1$ can cause the corresponding sampling switch 312 to transition to the open state on clock cycle 1, drive signal $\Phi_2$ can cause the corresponding sampling switch 312 to transition to the open state on clock cycle 2, drive signal $\Phi_3$ can cause the corresponding sampling switch 312 to transition to the open state on clock cycle 3, and drive signal $\Phi_4$ can cause the corresponding sampling switch 312 to transition to the open state on clock cycle 4. In general, drive signal $\Phi_N$ can cause the corresponding sampling switch 312 to transition to the open state on clock cycle N.

Each isolation inductor 320 is electrically coupled between a corresponding T/H circuit 310 and the input buffer 300. For example, each isolation inductor 320 can be electrically coupled in series between the input buffer and the corresponding T/H circuit 310. Each inductor can have an inductance of less than or equal to about 100 pH, such as about 25 pH, about 50 pH, about 75 pH, but different ranges of values may be desired for different applications. As used herein, "about" means plus or minus 10% of a given value.

Figure 1:
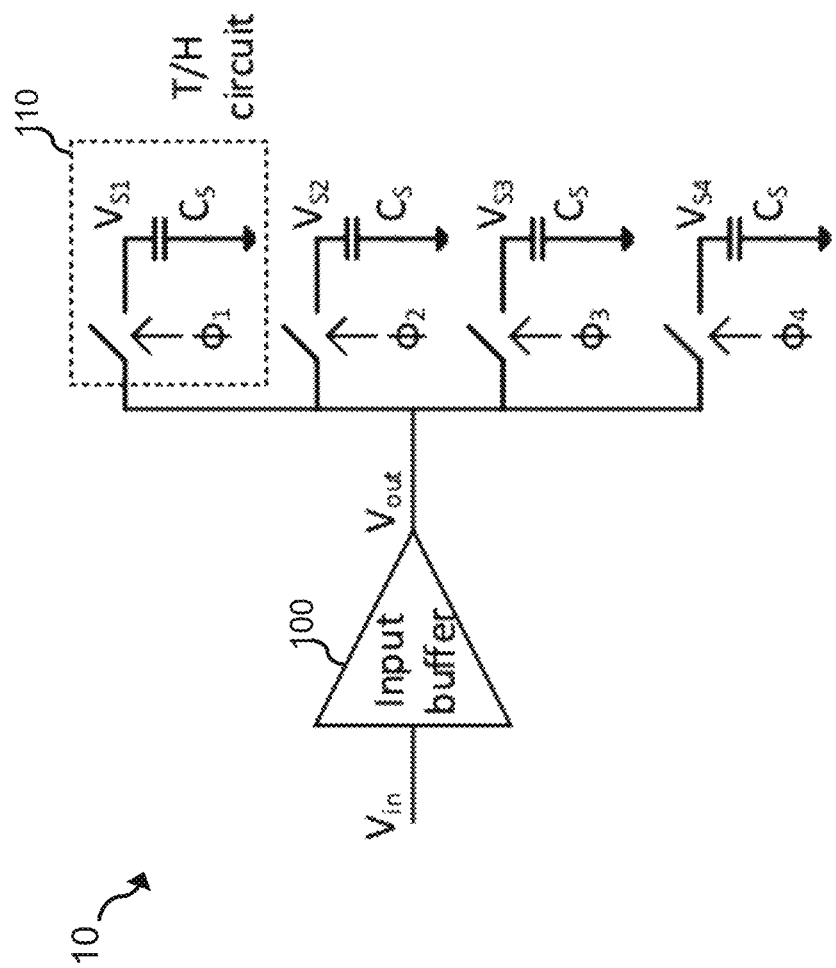
FIG. 1 is a schematic diagram of an ADC frontend driven by an input buffer according to the prior art.
Figure 2:
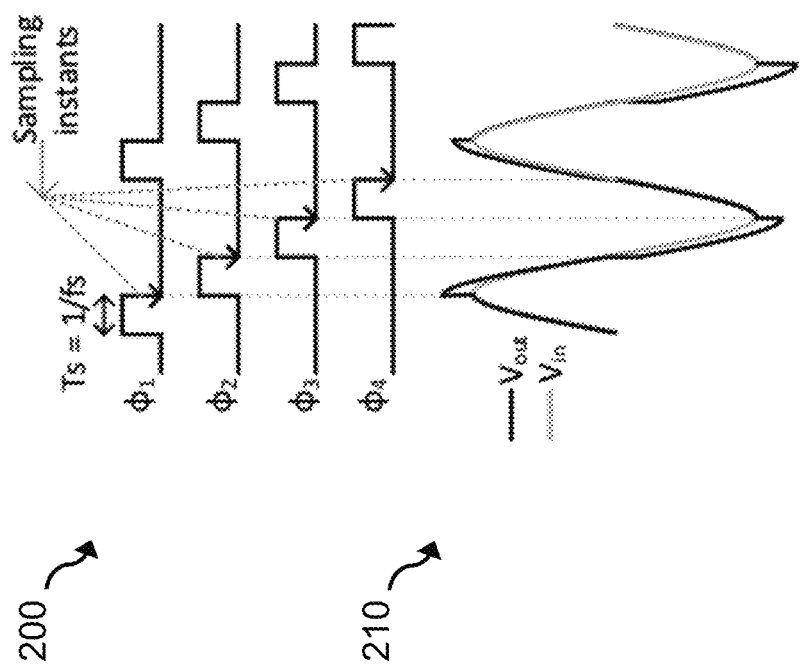
FIG. 2 illustrates a timing diagram and the corresponding input and output voltages of the ADC frontend illustrated in FIG. 1.

FIG. 4 illustrates a timing diagram 400 of the TI circuit 30 and the corresponding input and output voltages ($V_{IN}$, $V_{OUT}$) 410 of the input buffer 300. At the sampling instants, when the sampling switches 312 turn off (i.e., close), the respective isolation inductors 320 isolates the subsequent voltage kickback from the input buffer 300. As a result, the buffer output voltage ($V_{OUT}$) exhibits significantly reduced kickback compared to the prior art (e.g., FIG. 2). Little additional power is now needed to fully settle the signal dependent fraction of the voltage kickback. Furthermore, employing the isolation inductors 320 increases the tracking bandwidth due to shunt peaking, which improves tracking bandwidth especially when the input frequency is near Nyquist frequency (i.e., 0.5 fs). Since the voltage kickback is at fairly high frequency (e.g., >3 fs), the isolation inductor can have a relatively small inductance value (e.g., about 100 pH, as discussed above), which results in a small increase in semiconductor die area.

Figure 5:
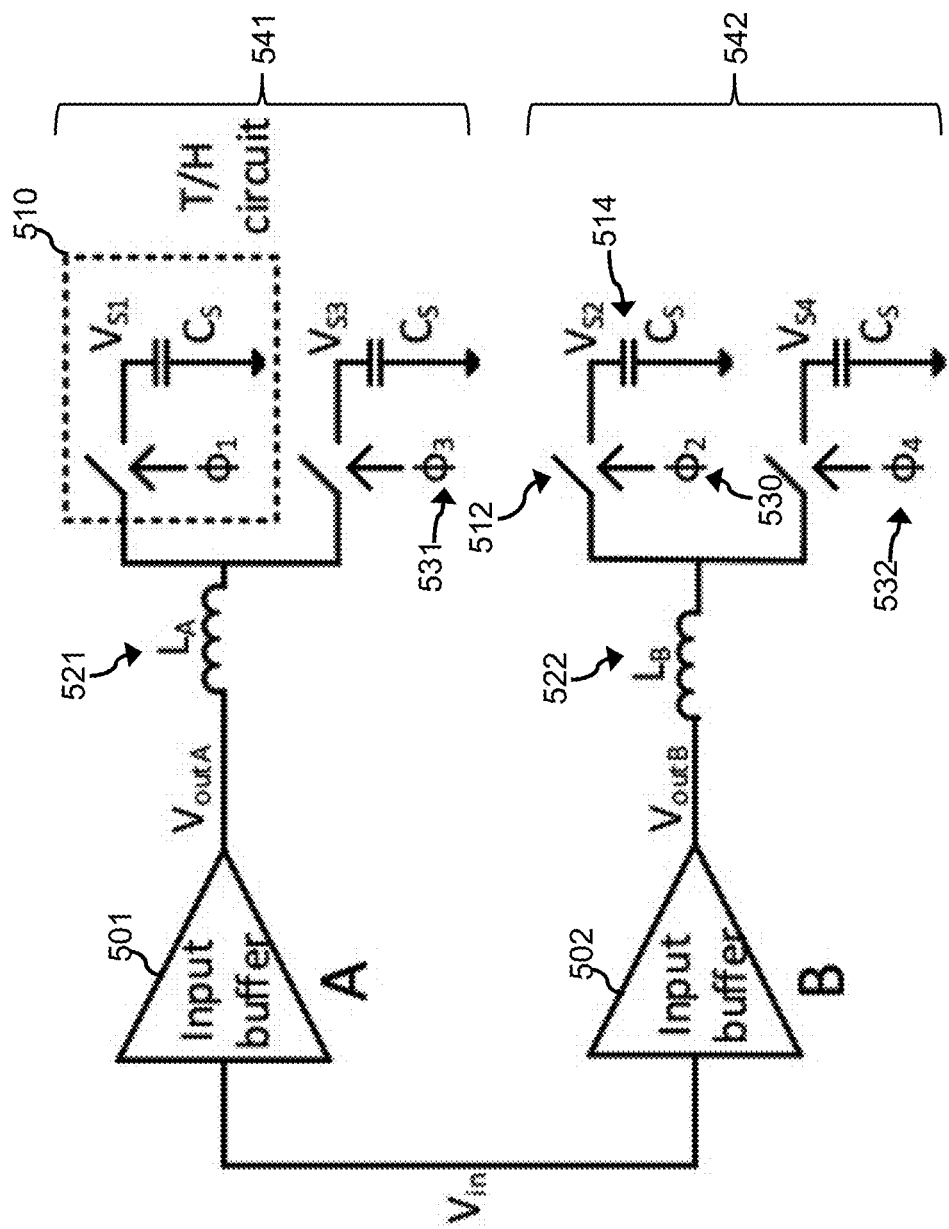
FIG. 5 is a schematic diagram of a TI circuit according to an alternative embodiment.

FIG. 5 is a schematic diagram of a TI circuit 50 according to an alternative embodiment. The circuit includes a first input buffer 501 (e.g., input buffer A), a second input buffer 502 (e.g., input buffer B), a first group 541 of T/H circuits 510, a second group 542 of T/H circuits 510, a first isolation inductor 521 (e.g., isolation inductor A), and a second isolation inductor 522.

The first and second input buffers 501, 502 have respective inputs that are electrically coupled to an input signal having an input voltage $V_{IN}$ which can be time-varying. The first and second input buffers 501, 502 produce respective output signals having respective output voltages $V_{OUTA}$, $V_{OUTB}$. Each output signal and output voltage $V_{OUTA}$, $V_{OUTB}$ can be related to the input signal and input voltage, respectively. The input buffers 501, 502 are preferably identical or substantially identical to each other. Each input buffer 501, 502 can be the same as or different than input buffer 300.

The T/H circuits 510 in each group 541, 542 are electrically coupled in parallel with each other. The T/H circuits 510 are preferably identical or substantially identical to each other. Each T/H circuit 510 can be the same as or different than T/H circuit 310. Each T/H circuit 510 includes a sampling switch 512 and a sampling capacitor 514. Each group 541, 542 can have any number of T/H circuits 510, such as about 2-30 T/H circuits, including about 5 T/H circuits, about 10 T/H circuits, about 15 T/H circuits, about 20 T/H circuits, about 25 T/H circuits, or any value or range between any two of the foregoing number of T/H circuits. Each group 541, 542 preferably has the same number of T/H circuits 510. For example, each group 541, 542 preferably has N T/H circuits.

Figure 6:
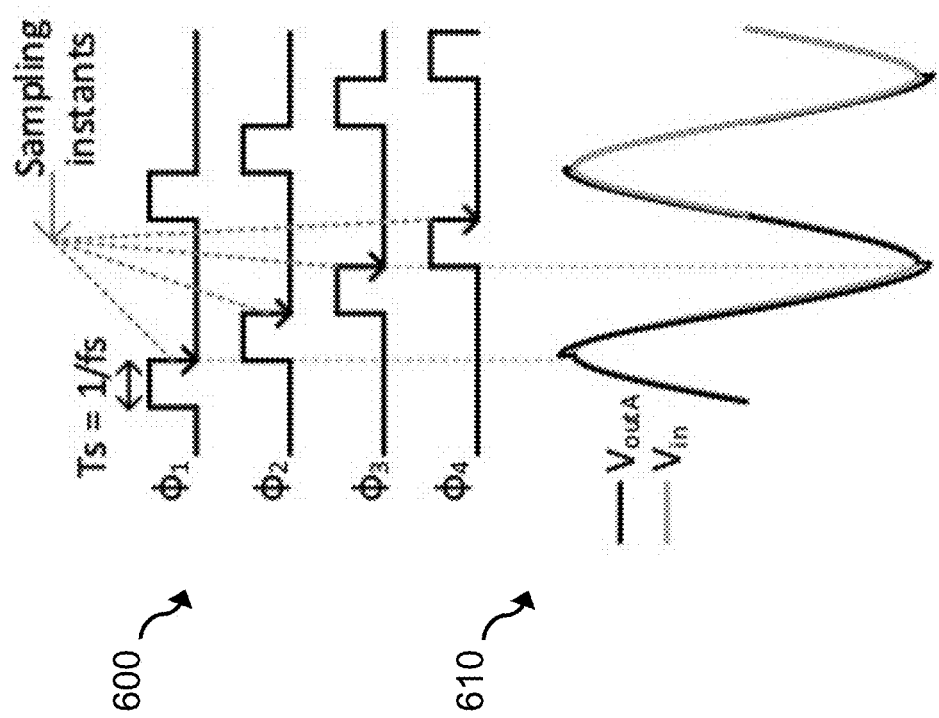
FIG. 6 illustrates a timing diagram and the corresponding input and output voltages of the TI circuit illustrated in FIG. 5.

The state of each sampling switch 512 is controlled by a respective drive signal 530. The drive signals 530 are configured to cause the sampling switches 512 to transition from a closed state to an open state. The drive signals 530 can be the same as or different than drive signals 330. The drive signals 530 are phase-offset such that the sampling switches 512 enter the open state on different clock cycles and/or in a predetermined time sequence (e.g., as illustrated in FIG. 6). The T/H circuits 510 in the first group 541 are configured to receive odd drive signals 531 that cause the corresponding sampling switches 512 in the first group 541 of T/H circuits 510 to enter the hold state on odd or relative odd clock cycles. The T/H circuits 510 in the second group 542 are configured to receive even drive signals 532 that cause the corresponding sampling switches 512 in the second group 542 of T/H circuits 510 to enter the hold state on even or relative even clock cycles. A relative even or odd clock cycle can be even or odd compared to a first drive cycle (e.g., drive signal $\Phi_1$) in the predetermined sequence where the first drive signal can be set as an odd clock cycle without regard to the absolute clock cycle.

In this configuration, the predetermined sequence alternates between T/H circuits 510 in the first group 541 and T/H circuits 510 in the second group 542 (e.g., in a ping-pong arrangement or configuration). For example, drive signal $\Phi_1$ can cause the corresponding sampling switch 512 (e.g., switch 1) in first group 541 to transition to the open state on clock cycle 1, drive signal $\Phi_2$ can cause the corresponding sampling switch 512 (e.g., switch 2) in second group 542 to transition to the open state on clock cycle 2, drive signal $\Phi_3$ can cause the corresponding sampling switch 512 (e.g., switch 3) in first group 541 to transition to the open state on clock cycle 3, and drive signal $\Phi_4$ can cause the corresponding sampling switch 512 (e.g., switch 4) in second group 542 to transition to the open state on clock cycle 4.

The first and second isolation inductors 521, 522 are electrically coupled to the first and second groups 541, 542, respectively, and the first and second input buffers 501, 502, respectively. For example, the first isolation inductor 521 is electrically coupled in series with the output of the first input buffer 501. The first isolation inductor 521 is also electrically coupled in series with the first group 541 of T/H circuits 510. Since the T/H circuits 510 in the first group 541 are electrically coupled in parallel with each other, the first isolation inductor 521 is also electrically coupled in series with each T/H circuit 510 in the first group 541. Similarly, the second isolation inductor 522 is electrically coupled in series with the output of the second input buffer 502. The second isolation inductor 522 is also electrically coupled in series with the second group 542 of T/H circuits 510. Since the T/H circuits 510 in the first group 541 are electrically coupled in parallel with each other, the second isolation inductor 522 is also electrically coupled in series with each T/H circuit 510 in the second group 542. The first and second inductors 521, 522 are preferably identical or substantially identical to each other (e.g., having an inductance values within 10% of each other). The first and second inductors 521, 522 can be the same as different than inductor 320.

The embodiment of FIG. 5 can alleviate the linear increase of inductor semiconductor die area with the number of interleaved T/H circuits (e.g., as described above). In this implementation, the input buffer is split in two halves A and B (e.g., first and second input buffers 501, 502 with 50% power each), with their inputs shorted. Further, the interleaved T/H circuits 510 are arrayed in a ping-pong configuration with T/H circuits 510 operating on odd clock phases or cycles are driven by the first input buffer 501 (bank A) while T/H circuits 510 operating on odd clock phases or cycles are driven the second input buffer 502 (bank B). This ping-pong configuration provides inherent isolation between the two groups 541, 542 and banks A, B, respectively. In addition, the ping-pong configuration reduces the number of isolation inductors compared to the embodiment of FIG. 3. In FIG. 5, only one isolation inductor 521 is coupled to the T/H circuits 510 in the first group 541 and only one isolation inductor 522 is coupled to the T/H circuits 510 in the second group 542. This configuration allows the number of T/H circuits 510 to be increased (or decreased) using only two isolation inductors, reducing the semiconductor die area used for isolation inductors compared to the configuration illustrated in FIG. 3. However, the configuration of FIG. 5 provides the same or substantially the same advantages as described above for the configuration illustrated in FIG. 3.

In general, TI circuit 50 can include N input buffers, N isolation inductors, and N groups of T/H circuits 510. Each input buffer is configured to receive an input signal having an input voltage and to output an output signal having a respective output voltage. Each group of T/H circuits 510 includes one or more T/H circuits 510. When a group includes a plurality of T/H circuits 510, the T/H circuits 510 in that group are electrically coupled in parallel with each other. A respective isolation inductor is electrically coupled to (e.g., electrically coupled in series with) the output of the respective input buffer and each T/H circuit 510 in the respective group of T/H circuits 510.

In an alternative embodiment, TI circuit 50 can include only one input buffer. In this embodiment, a first output of the input buffer is electrically coupled to the first isolation inductor 521 and to the first group 541 of T/H circuits 510, and a second output of the input buffer is electrically coupled to the second isolation inductor 522 and to the second group 542 of T/H circuits 510. The first and second outputs of the input buffer having the same voltage $V_{OUT}$, which can be related to the input signal and input voltage $V_{IN}$.

FIG. 6 illustrates a timing diagram 600 of the TI circuit 50 and the corresponding input and output voltages ($V_{IN}$, $V_{OUTA}$) 610 of the first input buffer 501. The input and output voltages ($V_{IN}$, $V_{OUTB}$) of the second input buffer 502 are identical or substantially identical to the input and output voltages ($V_{IN}$, $V_{OUTA}$) 610, respectively, of the first input buffer 501. As can be seen, $V_{OUTA}$ in FIG. 6 is the identical or substantially identical to $V_{OUT}$ in FIG. 4. In each embodiment, the buffer output voltage ($V_{OUT}$, $V_{OUTA}$) exhibits significantly reduced kickback compared to the prior art (e.g., FIG. 2). For example, at the sampling instants, when the sampling switches 512 turn off (i.e., close), the respective isolation inductors 521, 522 isolates the subsequent voltage kickback from the input buffers 501, 502, respectively. As a result, the buffer output voltage ($V_{OUTA}$, $V_{OUTB}$) exhibits significantly reduced kickback compared to the prior art (e.g., FIG. 2). Little additional power is now needed to fully settle the signal dependent fraction of the voltage kickback. Furthermore, employing the isolation inductors 521, 522 increases the tracking bandwidth due to shunt peaking, which improves tracking linearity especially when the input frequency is near Nyquist frequency (i.e., 0.5 fs). Since the voltage kickback is at fairly high frequency (e.g., >3 fs), the isolation inductors can have a relatively small inductance value (e.g., about 100 pH, as discussed above), which results in nominal increase in semiconductor die area.

Figure 7:
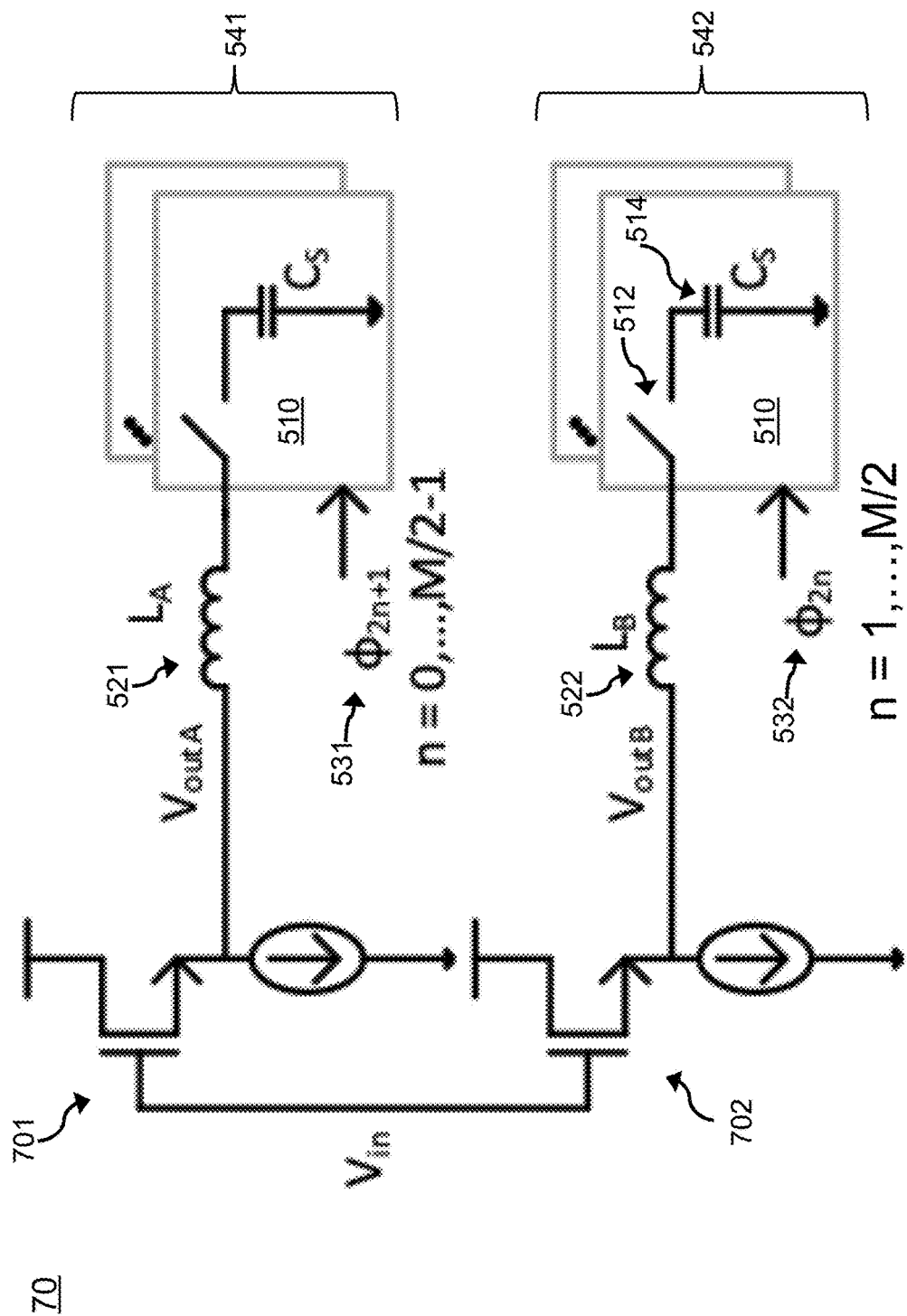
FIG. 7 is a schematic diagram of a TI circuit according to an embodiment.

FIG. 7 is a schematic diagram of a TI circuit 70 according to an embodiment. TI circuit 70 is the same as TI circuit 50 except that TI circuit 70 illustrates that the first and second input buffers 501, 502 are first and second source follower amplifiers 701, 702.

Figure 8:
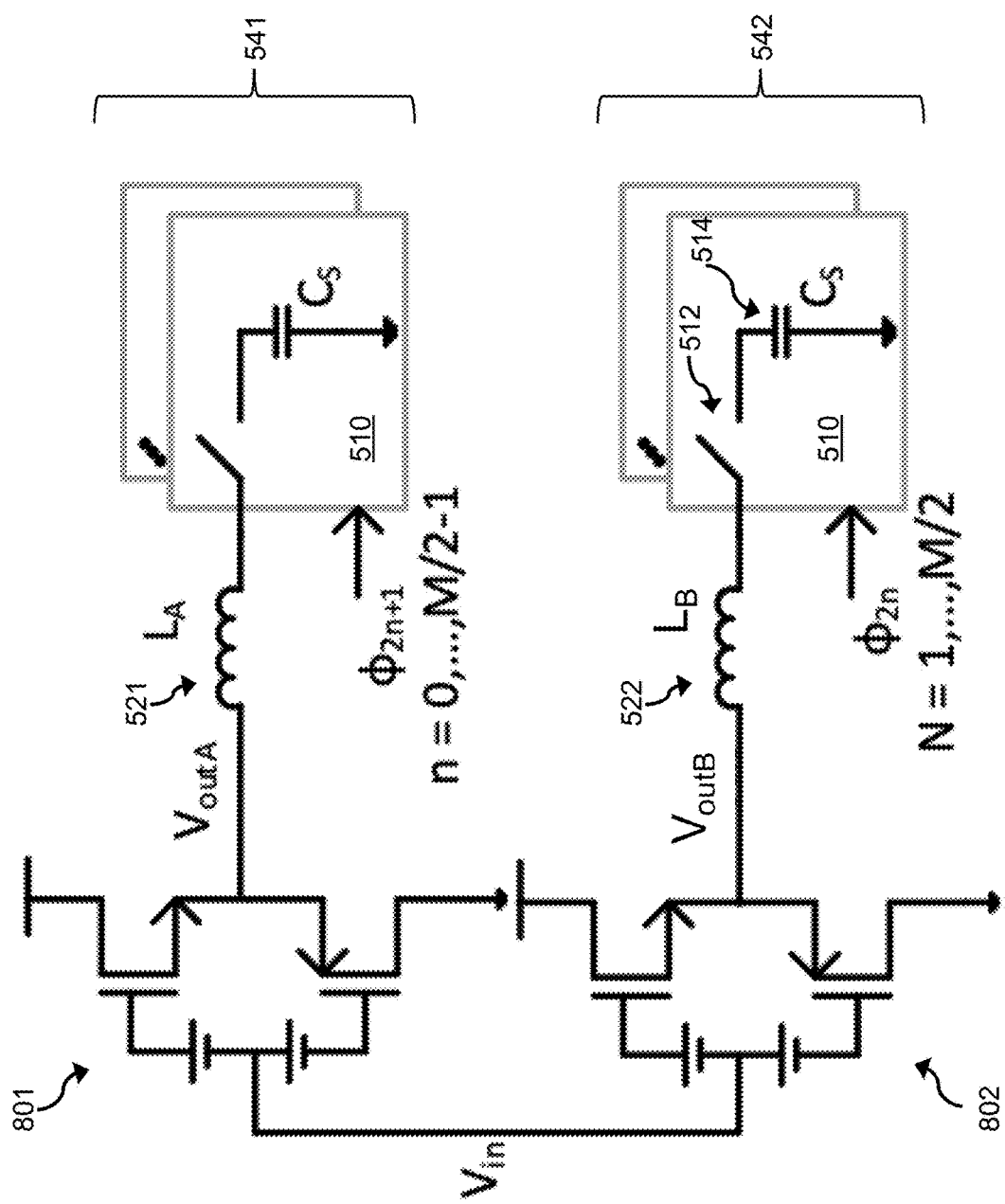
FIG. 8 is a schematic diagram of a TI circuit according to an embodiment.

FIG. 8 is a schematic diagram of a TI circuit 80 according to an embodiment. TI circuit 80 is the same as TI circuit 50 except that TI circuit 80 illustrates that the first and second input buffers 501, 502 are first and second push-pull amplifiers 801, 802.

In FIGS. 7 and 8, the TI circuits 70, 80 include a total of M T/H circuits 510 (i.e., an M-way TI circuit) where M is a positive even integer. Each group 541, 542 preferably includes the same number of T/H circuits 510 (i.e., M/2).

Any of circuits 30, 50, 70, and/or 80 can be formed on a single (e.g., monolithic) substrate and/or integrated in a single chip.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A time-interleaved circuit, comprising:
    an input buffer configured to receive an input signal having an input voltage and to output an output signal having an output voltage;
    a plurality of track-and-hold circuits electrically coupled in parallel with each other, each track-and-hold circuit electrically coupled in series with the input buffer; and
    an isolation inductor electrically coupled to the output of the input buffer and to an input of at least one of the track-and-hold circuits.

2. The circuit of claim 1, wherein the time-interleaved circuit comprises an analog-to-digital converter.

3. The circuit of claim 1, wherein the isolation inductor is a first isolation inductor in a plurality of isolation inductors, each isolation inductor electrically coupled to the output of the input buffer and to a respective input of only one of the track-and-hold circuits.

4. The circuit of claim 3, wherein each track-and-hold circuit comprises a sampling switch and a sampling capacitor.

5. The circuit of claim 1, wherein the input buffer comprises a source follower amplifier.

6. The circuit of claim 1, wherein the input buffer comprises a push-pull amplifier.

7. The circuit of claim 1, wherein the isolation inductor has an inductance of less than or equal to about 100 pH.

8. The circuit of claim 1, wherein the circuit is integrated into a single chip.

* * * * *